US006858492B2

(12) United States Patent
Bruchhaus et al.

(10) Patent No.: US 6,858,492 B2
(45) Date of Patent: Feb. 22, 2005

(54) METHOD FOR FABRICATING A SEMICONDUCTOR MEMORY DEVICE

(75) Inventors: Rainer Bruchhaus, Kanagawa-Pref (JP); Gerhard Enders, Olching (DE); Walter Hartner, Glen Allen, VA (US); Matthias Krönke, Dresden (DE); Thomas Mikolajick, München (DE); Nicolas Nagel, Naka-ku Yokohama (JP); Michael Röhner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/186,597

(22) Filed: Jul. 1, 2002

(65) Prior Publication Data

US 2003/0129796 A1 Jul. 10, 2003

(30) Foreign Application Priority Data

Jun. 29, 2001 (DE) .......................................... 101 31 627

(51) Int. Cl.[7] .......................................... H01L 21/8242
(52) U.S. Cl. ........................ 438/253; 438/233; 438/256; 438/399
(58) Field of Search ................................. 438/233, 239, 438/244, 253–256, 396–399

(56) References Cited

U.S. PATENT DOCUMENTS

| | | | | |
|---|---|---|---|---|
| 4,630,088 A | * | 12/1986 | Ogura et al. ................. 257/302 |
| 5,006,909 A | * | 4/1991 | Kosa ........................... 257/302 |
| 5,538,592 A | * | 7/1996 | Chen et al. ................... 438/396 |
| 5,712,813 A | * | 1/1998 | Zhang .......................... 365/149 |
| 5,828,094 A | * | 10/1998 | Lee .............................. 257/296 |
| 5,895,946 A | * | 4/1999 | Hamamoto et al. .......... 257/302 |
| 5,930,639 A | * | 7/1999 | Schuele et al. .............. 438/396 |
| 6,094,335 A | * | 7/2000 | Early ........................... 361/303 |
| 6,124,164 A | * | 9/2000 | Al-Shareef et al. ......... 438/240 |
| 6,208,501 B1 | * | 3/2001 | Ingalls et al. ............... 361/303 |
| 6,232,169 B1 | * | 5/2001 | Widmann et al. ........... 438/243 |
| 6,355,518 B1 | * | 3/2002 | Wu et al. ..................... 438/246 |
| 6,365,452 B1 | * | 4/2002 | Perng et al. ................. 438/241 |
| 6,448,615 B1 | * | 9/2002 | Forbes et al. ................ 257/369 |
| 6,504,198 B2 | * | 1/2003 | Morimoto .................... 257/295 |
| 6,528,366 B1 | * | 3/2003 | Tu et al. ...................... 438/253 |

FOREIGN PATENT DOCUMENTS

| | | |
|---|---|---|
| DE | 195 43 539 C1 | 4/1997 |
| DE | 198 34 649 C1 | 3/2000 |
| JP | 05 343 615 A | 12/1993 |

* cited by examiner

*Primary Examiner*—Amir Zarabian
*Assistant Examiner*—Khanh Duong
(74) *Attorney, Agent, or Firm*—Laurence A. Greenberg; Werner H. Stemer; Ralph E. Locher

(57) ABSTRACT

Capacitor devices are formed in an essentially vertically extending fashion in order to achieve an essentially three-dimensional configuration or a configuration extending into the third dimension. A contacting of plug regions is performed after producing the capacitor devices. Such capacitor devices provide an increased integration density in a semiconductor memory device.

50 Claims, 11 Drawing Sheets

METHOD FOR FABRICATING A SEMICONDUCTOR MEMORY DEVICE

BACKGROUND OF THE INVENTION

Field of the Invention

The invention relates to a method for fabricating a semiconductor memory device.

In modern semiconductor memory devices, in particular in chain FeRAMs (Ferro-Electric Random Access Memories) or the like, a plurality of capacitor devices are provided as storage elements in the form of a capacitor configuration in the region of a semiconductor substrate or the like and/or of a passivation region and/or of a surface region thereof.

An objective of the ongoing development of modern semiconductor memory technologies is, inter alia, the formation of the most extensive integration density possible. Conventional semiconductor memory devices which use capacitor devices as storage elements are limited with regard to the integration density to the effect that the capacitor devices used should not fall below a certain minimum size, and thus a minimum lateral extent, in order to function as storage capacitors or storage elements. Consequently, even with a minimum distance separating conventional capacitor devices, there is a resultant limit in the area density of storage elements and this area density cannot be exceeded. In this case, the respective minimum separating distance is given in each case by the minimum feature size of the respective lithographic technique.

SUMMARY OF THE INVENTION

It is accordingly an object of the invention to provide a semiconductor memory device and a method for fabricating a semiconductor memory device in which a particularly high integration density in conjunction with a functional reliability can be achieved.

With the foregoing and other objects in view there is provided, in accordance with the invention, a method for fabricating a semiconductor memory device, the method includes the steps of:

forming a CMOS structure in a horizontally extending semiconductor substrate region and/or a passivation region and/or a respective surface region thereof;

forming a capacitor configuration in the horizontally extending semiconductor substrate region and/or the passivation region and/or the respective surface regions thereof such that the capacitor configuration includes a plurality of capacitor devices serving as storage elements;

forming or patterning the capacitor devices in each case in an at least partially vertically and/or locally vertically extending manner with respect to the semiconductor substrate region and/or the passivation region and/or the respective surface regions thereof such that, as a result, in each case a three-dimensional assembly and/or a three-dimensional structure extending at least partially and/or locally into a third dimension with respect to a given region extending substantially in a first and a second dimension is formed, the given region being the semiconductor substrate region and/or the passivation region and/or respective surface regions thereof; and contacting the capacitor devices and electrode devices with the CMOS structure by contact regions after forming the capacitor devices.

In other words, in the method for fabricating a semiconductor memory device, in particular a chain FeRAM memory or the like, firstly a semiconductor substrate or the like, a passivation region and/or a surface region thereof with a CMOS structure are formed. This configuration is fundamental for the circuit of the semiconductor memory device. Furthermore, a capacitor configuration of a plurality of capacitor devices serving as storage elements is formed in the region of the semiconductor substrate or the like, a passivation region and/or a surface region thereof. Furthermore, in the method according to the invention for fabricating a semiconductor memory device, it is provided that the capacitor device is in each case formed and/or patterned in a fashion extending at least partially and/or locally essentially vertically or perpendicularly to the substrate with respect to the, in particularly essentially horizontally extending, semiconductor substrate or the like, a passivation region and/or a surface region thereof. Furthermore, it is provided according to the invention that, as a result, in particular in each case an essentially three-dimensional configuration or structure and/or a configuration or structure extending at least partially and/or locally essentially into the third dimension with respect to the, in particular essentially horizontally extending, semiconductor substrate or the like, a passivation region, and/or a surface region thereof, is formed and/or patterned for the respective capacitor device. Furthermore, it is provided according to the invention that a contact connection of the capacitor devices and of the electrode devices with the CMOS structure is formed by contact regions or plug regions after the production of the capacitor devices.

It is thus a fundamental idea of the method according to the invention to form and/or to pattern the respective capacitor devices in such a way that they run essentially in vertically extending fashion with respect to the surface of the semiconductor substrate or the like. What is thereby achieved is that the integration density and thus the area of the entire cell array is no longer dominated by the required area proportion of the electrode areas, but rather ultimately essentially by the resolution and the feature size of the patterning method during the formation of the capacitor configuration. In principle, the possibility is thus afforded of orienting the feature size or minimum lateral extent of a capacitor device to the physically required layer thicknesses for the capacitor electrodes and the dielectric.

In this case, a first and a second electrode device and also a dielectric—essentially provided between the latter—of the respective capacitor device are in each case formed and/or patterned at least partially and/or locally in a fashion extending essentially vertically or perpendicularly to the substrate with respect to the, in particular essentially horizontally extending, semiconductor substrate or the like, a passivation region and/or a surface region thereof. This is done in such a way that, in this case, in particular, the sequence of first electrode device, dielectric and second electrode device of the respective capacitor device is formed at least partially and/or locally in essentially horizontally extending fashion with respect to the, in particular essentially horizontally extending, semiconductor substrate or the like, a passivation region and/or a surface region thereof, in a form arranged one beside the other in the surface region of the semiconductor substrate and/or of a passivation region thereof.

In the text above and below, the term dielectric always means the central dielectric of the storage capacitor/the capacitor device and/or the so-called node dielectric. This is, in particular, a ferroelectric (SBT=Strontium Bismuth Tantalate, PZT=Lead Zirconate Titanate, . . . ), a paraelectric or the like.

It is preferably provided that the, in particular essentially horizontally extending, semiconductor substrate or the like, and/or a surface region thereof and in particular the CMOS structure are at least partially covered and/or embedded by at least one first essentially top-situated and/or essentially laterally extending passivation region made of an essentially electrically insulating material, in a two-dimensional, large- and/or whole-area manner and/or with a planar surface region. This measure creates an isolation between the actual semiconductor substrate and the CMOS structure formed therein, and the capacitor configuration that is to be arranged thereabove. The passivation region is deposited in particular in an essentially two-dimensional, large- and/or whole-area manner and/or in particular with a planar surface.

In an advantageous manner, a barrier region or a barrier layer is formed on the first passivation region, in particular in an essentially two-dimensional, large-area and/or whole-area manner and/or in particular with an essentially planar surface region. This is done in order essentially to shield underlying regions, in particular the CMOS structure, against the diffusion of undesirable and/or disturbing ambient elements and thus to avoid a chemical conversion, in particular an oxidation with constituents of an ambient or process atmosphere, in particular of subsequent process steps.

Preferably, a second passivation region is deposited and/or formed on the barrier region or on the barrier layer, in particular in an essentially two-dimensional, large-area and/or whole-area manner and/or in particular with an essentially planar surface region.

At defined first regions and/or at defined first locations in the passivation region, cutouts are formed, in particular through the use of a, preferably selective, etching process or the like and/or in particular in a manner spaced apart essentially vertically from the level of the barrier region and/or of a surface region thereof. In this case, in particular, essentially electrically insulating elevated regions are formed on the barrier region.

Regions essentially above and between source/drain regions of selection transistor devices provided in the surface region of the semiconductor substrate and/or essentially between defined second regions or locations of contact regions or plug regions to be provided for the contact connection of the capacitor configuration to be formed with the CMOS structure of the semiconductor substrate or the like and/or of a surface region thereof are chosen in particular as defined first regions or as defined first locations.

It is provided that the cutouts are formed vertically at least partially as far as the level of the surface region of the barrier layer.

Furthermore or as an alternative it is provided that the cutouts are formed laterally at least partially at least as far as edge regions of plug regions or contact regions to be provided. In addition, it is provided in this case that as a result, the edge regions of the cutouts formed are provided as edge regions of the plug regions or contact regions to be provided. What is achieved by these measures is that the edges or walls of the cutouts simultaneously form edges or walls of the plugs to be provided. This is particularly advantageous with regard to the configuration of the contact connection with the electrode devices.

Subsequently, at least one material region for the electrode devices is then deposited. This is done in particular using at least one essentially electrically conductive material, for example a metal, a metal oxide and/or the like. Furthermore, the material region for the electrode devices is preferably deposited in a conformal manner, in the form of a 2D deposition technique, in a large- and/or whole-area manner, in particular edge regions of the cutouts and/or the elevated regions being lined and/or covered.

Consequently, through the use of the measures outlined above, the capacitor configuration with the plurality of capacitor devices is fundamentally prepatterned, a contact connection of the electrode devices of the capacitor devices with the plug regions and the CMOS structure formed underneath being inherently ensured.

In this case, an isolation or separation of the electrode devices that are not to be contact-connected may optionally be necessary. This is realized in particular by virtue of the fact that at least essentially laterally extending regions of the material region for the electrode devices are eroded and removed to the level, in particular by an anisotropic etching-back or the like.

As a result, in particular, essentially vertically extending regions are formed adjacent to the insulating elevated regions. These vertically extending regions of essentially electrically conductive material then form the electrode devices of the capacitor devices.

A further aspect of the method according to the invention is based on the fact that, on lateral bottom regions or the like of the cutouts, in particular on the free surface of the barrier region, in each case a barrier and/or insulation region for the dielectric to be provided is formed, in particular by specific and/or anisotropic, that is to say essentially directed, deposition, and/or in particular using at least one essentially electrically insulating material.

In an advantageous manner, the barrier and/or insulation region for the dielectric is in each case formed in a plurality of layers. In addition or as an alternative it is provided that the barrier and/or insulation region for the dielectric is formed in a topmost region—essentially remote from the semiconductor substrate or the like—and/or a surface region thereof in each case as nucleation layer for the dielectric that is subsequently to be applied and/or for the crystal growth of the dielectric, in particular in order to form the crystal structure and/or the ferroelectric property of the dielectric.

Furthermore, it is preferred that in particular on the respective barrier and/or insulation region for the dielectric—a material region for the dielectric is deposited, in particular in the form of a ferroelectric or the like in particular by a two-dimensional or 2D deposition process, in a conformal manner, large-area manner and/or whole-area manner and/or a form which fills the first cutouts as far as the level of the surface region of the barrier region, and/or by subsequent polishing as far as the level of the surface region of the second passivation region. This is done in particular in order to form a respective region for the dielectric between electrode devices.

Subsequently, in accordance with a further embodiment of the fabrication method according to the invention, the material layer for the dielectric and/or the dielectric may be subjected to a heat treatment process, in particular at elevated temperature and/or in a defined process atmosphere, which contains in particular oxygen or the like, to be precise without damaging the regions below the layer for the barrier and/or insulation region for the dielectric.

In accordance with a further embodiment of the method according to the invention, it is provided that second cutouts are formed at the defined second regions or the defined second locations, in particular above the source/drain regions of the selection transistor devices. This is done in particular through the use of a, preferably selective, etching process or the like. In this case, in particular, the essentially electrically insulating elevated regions are essentially removed in such a way that side regions or edge regions of the electrode devices are uncovered at least in part. Furthermore, in this case, in particular, the barrier region and also the first passivation region in the region of the second defined locations or second defined regions are eroded as far as the level of the surface region of the semiconductor substrate in such a way that the surface region of the source/drain regions is uncovered in each case.

This has the advantage, in particular, in accordance with a further embodiment, that a material region of an essentially electrically conductive material can be deposited, in particular through the use of a two-dimensional or 2D deposition method, in a conformal form, large-area form, whole-area form and/or a form which fills the second cutouts in each case as far as the level of the surface region of the source/drain regions, and by subsequent polishing or the like as far as the level of the surface regions of the electrode devices and/or of the dielectric. In this case, it is provided, in particular, that, as a result, first electrode devices or second electrode devices that are opposite one another in the second cutouts are in essentially electrically conductive contact together with the respective source/drain regions.

In a further preferred embodiment of the method according to the invention, it is provided that at least some of the capacitor devices are contact-connected by their respective first electrode device via a first contact element to the first electrode device of a first essentially spatially adjacent capacitor device and by their second electrode device via a second contact element to the second electrode device of a second essentially directly spatially adjacent capacitor device of the capacitor configuration, in order to form a capacitor configuration with an at least partly connected or chain structure. In this case, it is furthermore provided, in particular, that the first electrode devices that are contact-connected to one another and/or the second electrode devices are in each case formed as an essentially contiguous and/or integral or one-part electrically conductive region. This is done, in particular, together with a respective first contact element or the like and/or, in particular, in each case together with a plug region or contact region or the like.

In the case of the device, it is provided that, in particular in a chain FeRAM memory, the capacitor device is in each case formed in a fashion extending at least partially and/or locally essentially vertically or perpendicularly to the substrate with respect to the, in particularly essentially horizontally extending, semiconductor substrate or the like, a passivation region and/or a surface region thereof, and that, as a result, in particular in each case an essentially three-dimensional configuration or structure and/or a configuration or structure extending at least partially and/or locally essentially into the third dimension with respect to the, in particular essentially horizontally extending, semiconductor substrate or the like, a passivation region, and/or a surface region thereof, is formed for the respective capacitor device.

It is thus a central concept of the present invention to vertically orient the storage capacitors of the capacitor configuration of the semiconductor memory device—in contrast to the conventional configuration in which the capacitor devices are formed horizontally or in laterally extending fashion. Specifically, the area of the respective capacitor device is then determined and given not by the electrode areas but rather ultimately by the respective layer thicknesses which are required for the electrode devices and for the dielectric. This means that a further increase in the integration density can be achieved, because the required area proportions for the electrodes and for the dielectric are provided by the three-dimensional patterning.

In this case, the respective capacitor devices in each case have a first electrode device, a second electrode device and a dielectric essentially provided between the latter.

In an advantageous manner, the capacitor device is in each case formed as a stack structure or has such a structure, thereby resulting in a particularly compact configuration, which can only be realized in an inadequate manner in the case of an offset structure.

It is provided, in particular, that the electrode device and/or the dielectric of the respective capacitor device are formed at least partially and/or locally in essentially vertically extending fashion with respect to the, in particular essentially horizontally extending, semiconductor substrate or the like and/or with respect to an insulation region or passivation region and/or with respect to a surface region thereof. In this case, it is provided, in particular, that the sequence of first electrode device, dielectric and second electrode device of the respective capacitor device is formed at least partially and/or locally in essentially horizontally extending fashion with respect to the, in particular essentially horizontally extending, semiconductor substrate or the like and/or with respect to an insulation region or passivation region and/or with respect to a surface region thereof, in particular in a form arranged one beside the other in the surface region of the semiconductor substrate or the like and/or of an insulation region or passivation region thereof. In accordance with this measure, it is provided, then, that the sequence of the electrode devices and the dielectric forms, as it were, a stack which is perpendicular to the surface of the semiconductor substrate or the passivation region thereof, the sequence, that is to say the stack direction, extending in the horizontal direction and the respective regions, namely the first and second electrodes and the dielectric provided between the latter, running perpendicularly.

In an advantageous manner, the dielectric in each case has a ferroelectric and/or a paraelectric material or the like or is formed from such a material.

It is furthermore preferably provided that the capacitor configuration has, at least in part, a connected or chain structure of the capacitor devices. This form of the connection of the capacitor devices and the latters' utilization of common electrode devices is particularly space-saving and thus supports the formation of the highest possible integration densities.

In accordance with a further preferred embodiment, it is provided that, in order to realize the chain structure discussed above, at least some of the capacitor devices are formed in a manner contact-connected by their respective first electrode device via a first contact element to the first electrode device of a first essentially directly spatially adjacent capacitor device and by their second electrode device via a second contact element to the second electrode device in the second essentially spatially directly adjacent capacitor device of the capacitor configuration.

The contact elements can also be referred to as contact or junction regions. Preferably, in this case, the first electrode devices and/or second electrode devices that are in each case contact-connected to one another in each case form an essentially contiguous, one-part and/or integral electrically conductive region. This can be done, for example, by forming the respective contact-connected electrode devices for example in the form of a contiguous metal region or the like. On the other hand, it is conceivable for the electrode devices that are contact-connected to one another to form in each case separate conductive, for example metallic, regions which are contact-connected to one another via a respectively provided first or second contact element. An interaction of the electrodes with parts of the plug regions may also be provided.

For the contact connection and/or interconnection of the capacitor configuration and/or in particular of the capacitor devices, in particular the electrode devices, in the semiconductor substrate or the like and/or in a covering layer or passivation layer and/or in a surface region thereof, a contact region or plug region is in each case provided, which is formed in a manner essentially electrically conductively contact-connected in each case in particular with the respective capacitor device, in particular with the respective electrode device thereof. This means that the circuit underlying the semiconductor memory device, for example in the form of a CMOS structure, is connected to the capacitor electrodes or electrode devices via the respective contact regions or plug regions. This is done for example through the use of direct contact connection of the plug regions to the individual electrodes or to the first or contact elements provided, which connect the electrode devices to one another.

It is advantageously furthermore provided that the electrode devices are arranged and/or formed in each case essentially in a region in direct spatial proximity to the contact regions or plug regions, in particular in a manner directly adjoining the latter and/or in particular directly above the latter on the surface region of the semiconductor substrate or a covering layer or passivation layer thereof.

The application and patterning of a dielectric is problematic, in principle, because a multiplicity of parameters must be optimized in order to realize desired electrical properties for the capacitor devices to be formed.

Accordingly, in accordance with a further advantageous configuration of the semiconductor memory device according to the invention, it is provided that a barrier and/or insulation region for the dielectric, made of an essentially electrically insulating material, is provided between the dielectric and the region of the semiconductor substrate or the like and/or the passivation region and/or the surface region thereof. This material serves on the one hand as mechanical contact layer and transition layer between the semiconductor surface or passivation surface and the dielectric. Furthermore, the electrical insulation of the dielectric from the semiconductor material and/or the passivation material continues to be ensured, so that leakage currents are avoided to the greatest possible extent.

In this case, the barrier and/or insulation region for the dielectric is optionally formed in a multilayer manner, in order to achieve the functioning ascribed to it in a particularly favorable manner.

In accordance with a particular embodiment, it is provided that at least the region facing the dielectric or the corresponding layer of the barrier and/or insulation region for the dielectric, that is to say in particular a surface region thereof, is formed as a nucleation layer or the like, in order to support and/or stabilize a desired structure, in particular a crystal structure or the like, for the dielectric during processing, during heat treatment and/or during operation of the semiconductor memory device. In particular, in this case, a crystal growth process is conceivable which is initiated on the surface region of the barrier and/or insulation region for the dielectric layer, that is to say the nucleation step, and which, by virtue of its structure, controls and constrains a specific crystal geometry or crystal orientation during the production or during the growth of the dielectric material.

Further aspects and advantages of the present invention emerge from the remarks given below:

During the fabrication of ferroelectric capacitors for applications in nonvolatile semiconductor memories having a high integration density, a ferroelectric material is used as dielectric between the electrodes of a storage capacitor. This may involve materials such as $SrBi_2(Ta,Nb)_2O_9$ (SBT or SBTN), $Pb(Zr,Ti)O_3$ (PZT), or $Bi_4Ti_3O_{12}$ (BTO) or the like. It is also possible to use paraelectric materials, for example $(Ba,Sr)TiO_3$ (BST).

Since, after the deposition of the dielectric, the latter is subjected to a heat treatment process with regard to its crystal structure and its electromagnetic, in particular ferroelectric, properties, the material for the electrodes should be able to withstand high temperatures in an oxygen-containing atmosphere. Noble metals or metallic oxides are thus appropriate. In particular, Pt, Pd, Ir, Rh, Ru, $RuO_x$, $IrO_x$, $RhO_x$, $SrRuO_3$, LSCO ($LaSrCoO_x$), HT (High Temperature) superconductors ($YBa_2Cu_3O_7$, ... ) or the like can be used.

Conventional semiconductor memory devices and, in particular, ferroelectric semiconductor memories are disadvantageous to the effect that their integration density is critically limited by the minimum requirements with regard to the electrode areas. This is due to the fact that the electrodes are arranged in horizontal orientation with respect to the surface of the semiconductor substrate or its passivation region. Furthermore, the electrode devices of the capacitors are arranged essentially two-dimensionally as a result.

The basic concept of the present invention is the formation of a three-dimensional and/or vertical structure for ferroelectric storage capacitors for FeRAM memory modules in particular of the chain type.

In this case, vertical means that the electrodes of the storage capacitors are arranged vertically or running vertically in or with respect to the ferroelectric. A three-dimensional vertical capacitor is simple to miniaturize since in this case exclusively the layer thicknesses that are physically to be minimally complied with are a limiting factor for the integration density. A vertically arranged storage capacitor therefore requires a particularly small space on the surface of the semiconductor substrate. Consequently, a $4F^2$ cell is conceivable in the case of the chain concept with a vertical three-dimensional capacitor.

Other features which are considered as characteristic for the invention are set forth in the appended claims.

Although the invention is illustrated and described herein as embodied in a method for fabricating a semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In the intermediate stages, shown in diagrammatic sectional side views in FIGS. 1–11, during the fabrication of a semiconductor memory device according to the invention, identical or identically acting elements of the regions are designated by identical reference symbols, and their description is not repeated individually in detail for each figure.

Figure 1:
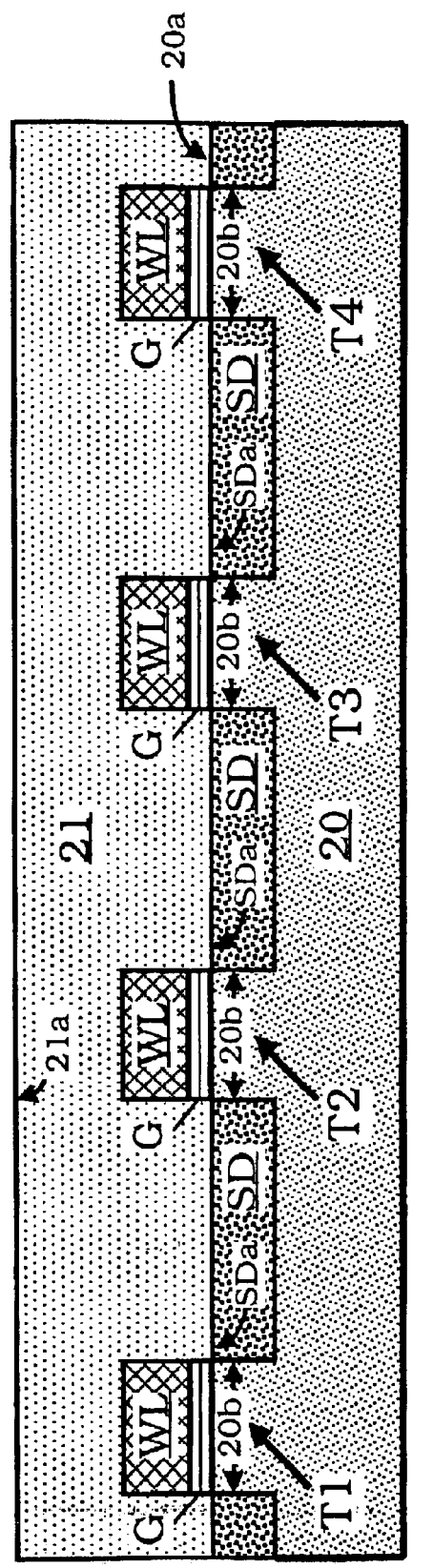
FIGS. 1–11 are diagrammatic sectional side views for illustrating various intermediate stages of the method according to the invention for fabricating a semiconductor memory device according to the invention.

The configuration shown in lateral cross-sectional view in FIG. 1 is the starting point in the construction of the semiconductor circuit device 1 according to the invention in accordance with the fabrication method according to the invention.

In an actual semiconductor substrate 20, a CMOS (Complementary Metal Oxide Semiconductor) structure serving for the interconnection of the semiconductor memory device 1 is formed in a preliminary process. In a surface region 20a of the semiconductor substrate 20, selection transistor devices T1 to T4 are provided for the selection of the memory cells to be formed, i.e. for the driving of the storage capacitors 10-1, . . . , 10-4 that are to be correspondingly formed. The selection transistor devices are formed by source/drain regions SD arranged in the surface region 20a of the semiconductor substrate 20. In this case, adjacent source/drain regions SD are arranged spaced apart from one another and are separated from one another by an intermediate region 20b in the surface region 20a of the semiconductor substrate 20.

Essentially electrically conductive word lines WL run above the intermediate regions 20b in the surface region 20a of the semiconductor substrate 20, in a manner electrically insulated through the use of gate oxide regions G. The gate oxide regions G of the individual selection transistor devices T1 to T4, the regions thereby functioning as gate, are driven via the word lines WL. So-called contact regions, plug regions or plugs P made of essentially electrically conductive material are provided above the source/drain regions SD, that is to say extending from the surface region 20a. The plugs P are in essentially electrically conductive contact with the source/drain regions SD.

The word lines WL, the gate oxide regions G and also the plugs P are embedded in a passivation region 21 formed from a silicon oxide, for example. The surface region 21a of the passivation region 21 is situated opposite the surface region 20a of the actual semiconductor substrate 20. Consequently, the plugs P extend from the surface region 20a, namely in electrically switching contact with the source/drain regions SD, with their own surface region Pa as far as the surface region 21a of the passivation region 21.

The configuration and structure shown in FIG. 1 can be formed through the use of conventional standard methods.

Proceeding from the basic structure shown in lateral cross-sectional view in FIG. 1, the invention proceeds as follows in order to form the semiconductor memory device 1 according to the invention:

Firstly, a barrier layer 12 with a surface region 12a is formed by a deposition process. This barrier layer 12 is intended to prevent diffusion of ambient elements into regions lying below this layer, in particular undesired and/or disturbing regions, during further processing and/or during operation of the semiconductor memory device. In particular, thought is given to preventing, through suppression of diffusion, preferably of oxygen or the like, chemical conversion processes and oxidative processes in the underlying layers and, in particular, in the region of contact points or plugs or the like.

Figure 2:
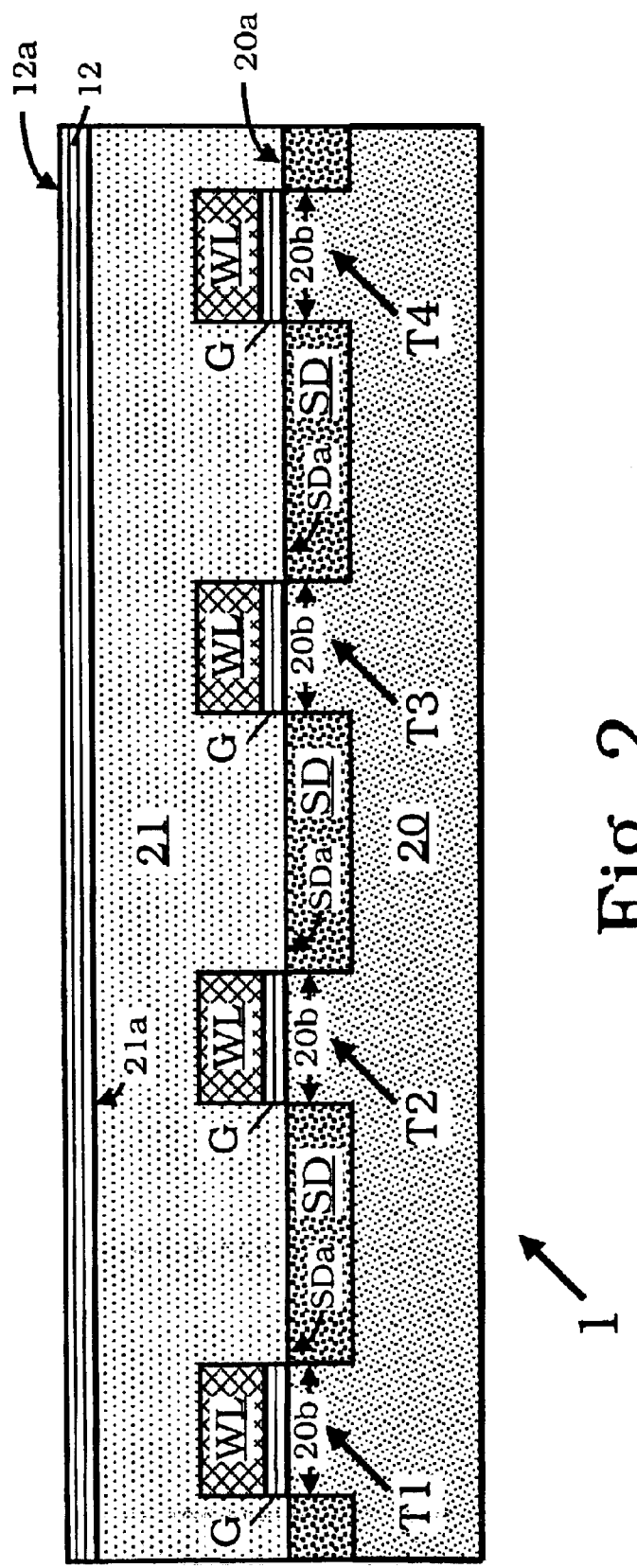

FIG. 2 shows the intermediate state with barrier regions 12 having been formed. The deposition process can be effected in an essentially two-dimensional, large- and/or whole-area manner in order to keep regions of attack for diffusion processes proportionately particularly small.

Figure 3:
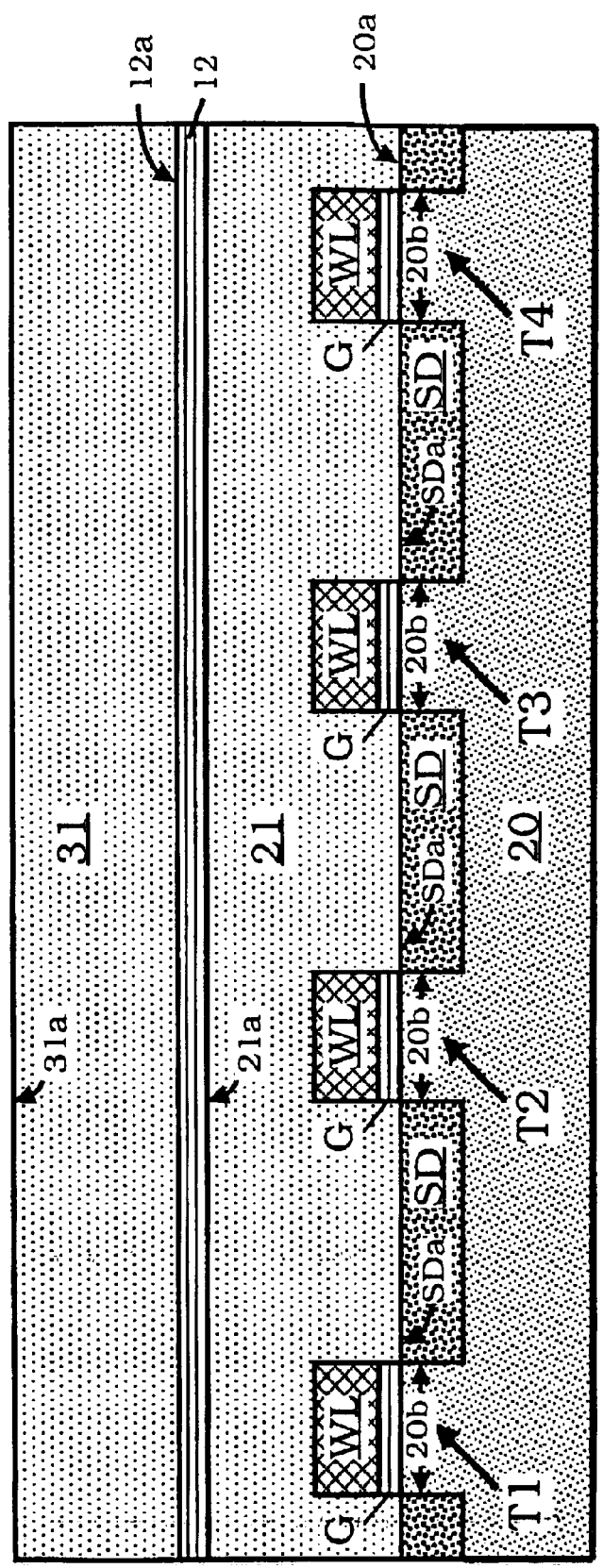

On the barrier region 12 with its surface region 12a, a second passivation region 31 with a surface region 31a is subsequently applied likewise in the context of an essentially two-dimensional, large- and/or whole-area deposition process, as is illustrated in the intermediate state shown in FIG. 3.

Figure 4:
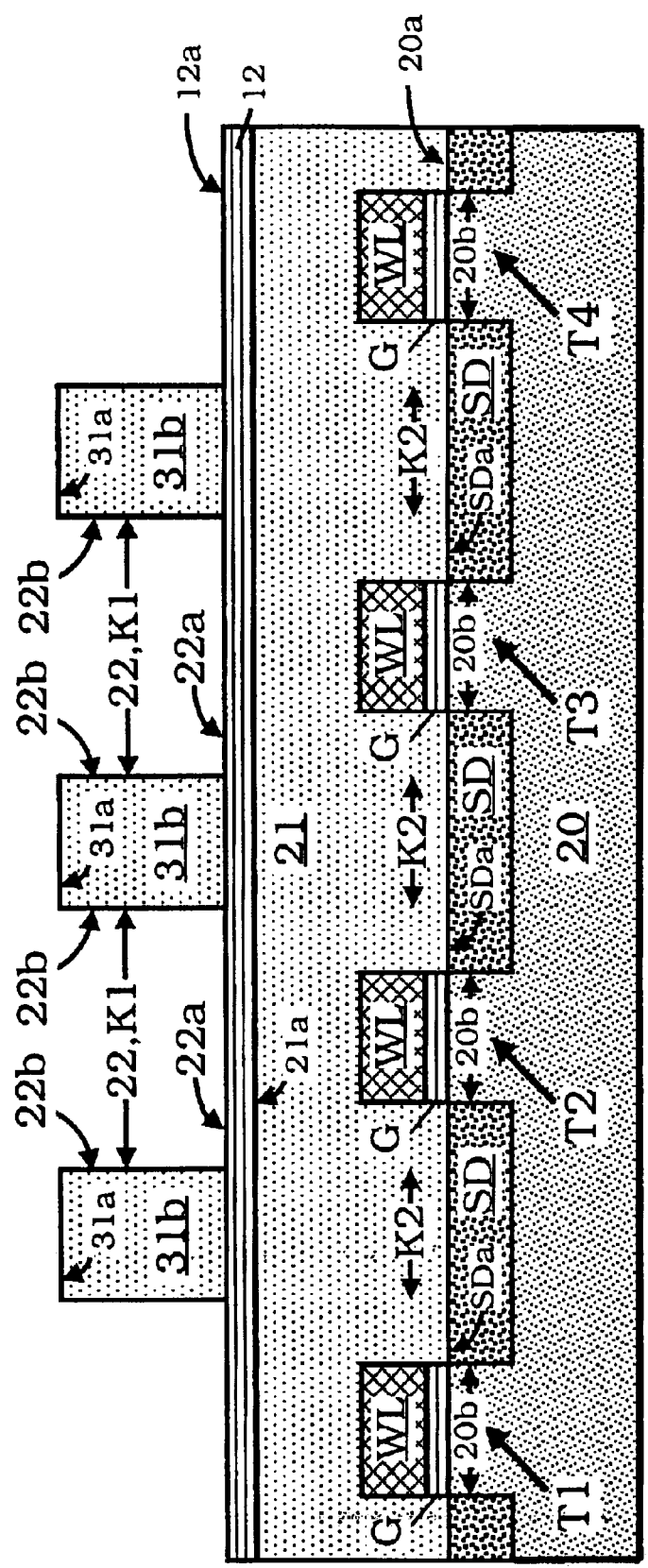

Within the context of an essentially anisotropic etching process or a lithography step, a plurality of first cutouts 22 are formed in the second passivation region 31, to be precise at defined first locations K1 between the plug regions P to be formed and above the word lines WL and gate regions G. In this case, the first cutouts 22 extend in the vertical direction, proceeding from the surface 31a of the second passivation region 31, to below the level of the surface 12a of the barrier region 12. In the lateral direction, the edge regions 22b of the first cutouts 22 that have been formed form edge regions Pb of plugs that are to be formed. The first cutouts 22 are thus bounded by the edge regions 22b at the sides and, toward the bottom, by the bottom regions 22a on the free surface of the second passivation region 31 and are otherwise open toward the top. This intermediate stage of the method according to the invention is shown in FIG. 4.

Figure 5:
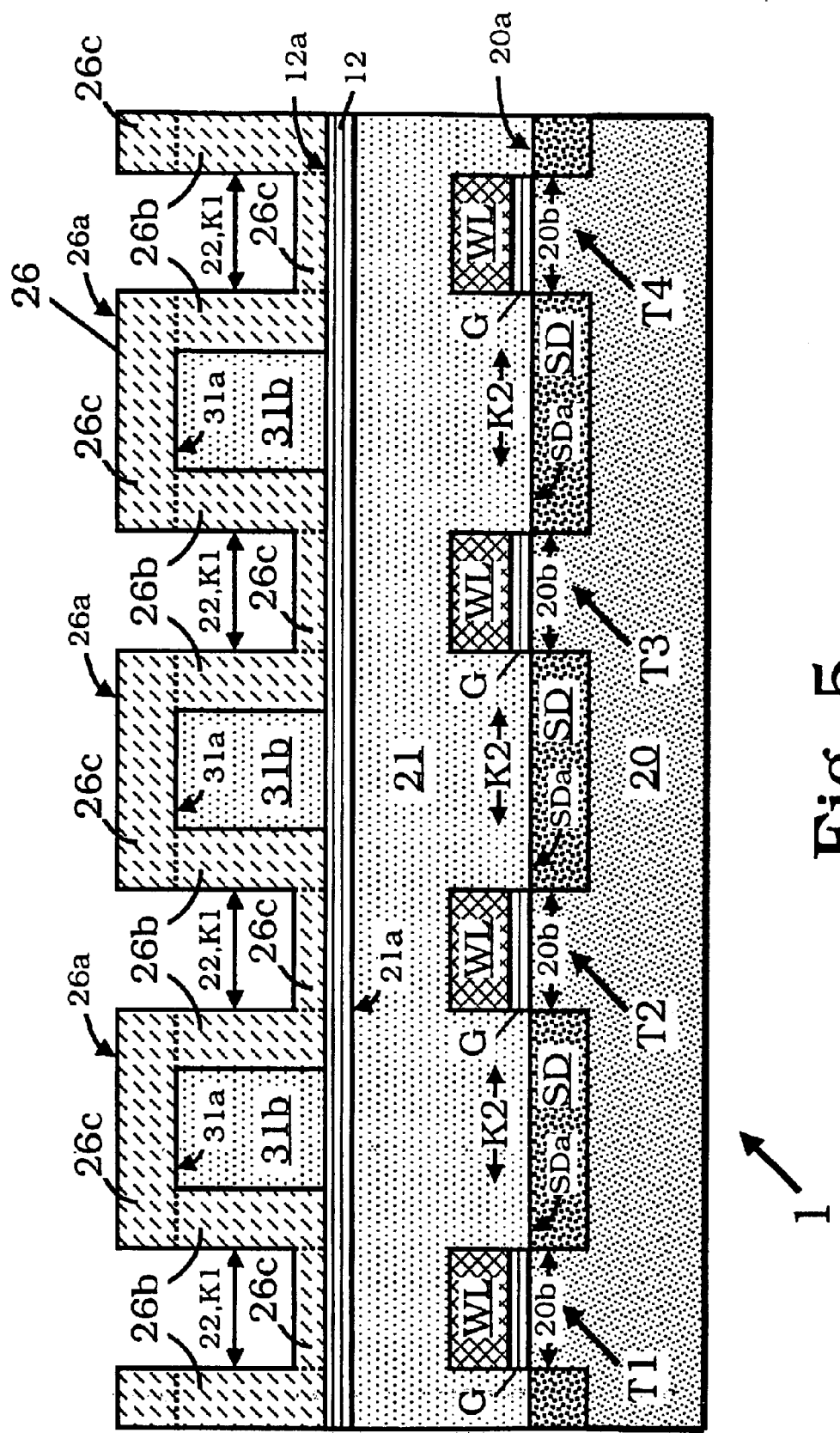

In the transition to FIG. 5, a material region 26 for the electrodes 14 and 18 to be formed is then deposited in a two-dimensional, whole-area and conformal manner on the prepatterned surface sequence 22a, 22b, 31a, so that the material of the material layer 26 for the electrodes 14 and 18 follows the contour which essentially follows through the areas 22a, 22b, 31a. In this way, material sections 26c are formed in a lateral direction and 26b in an essentially vertical direction on this surface contour.

In order to isolate the conductive regions 26b from one another, the conformally formed material layer 26 is etched back in an anisotropic etching process in such a way that the bottom regions 22a of the cutouts 22 and also the surface regions 12a of the barrier region 12 are freed of the conductive material of the layer 26, in other words the lateral material regions 26c are completely removed, and the vertically running material regions 26b remain as first electrodes 14 and second electrodes 18 which are in each case electrically insulated from one another by the elevated regions 31b.

Figure 6:
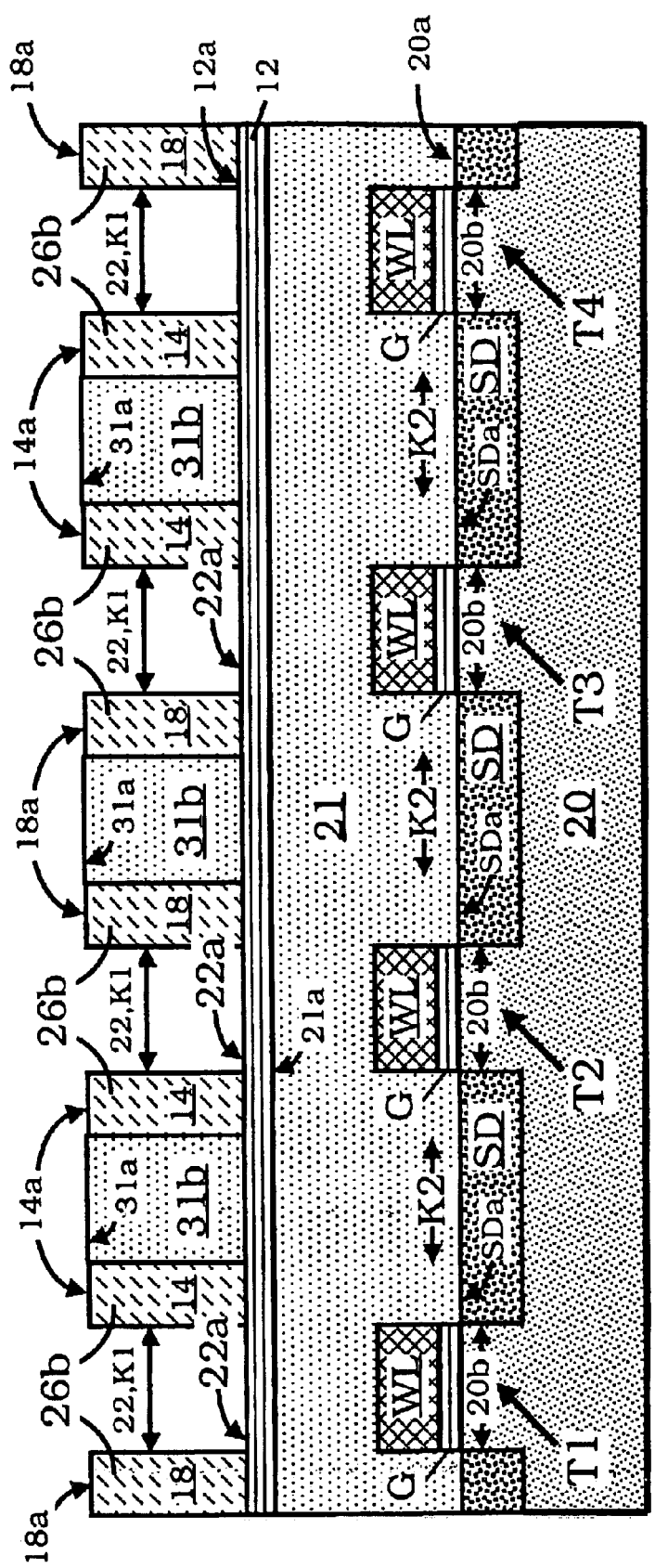

FIG. 6 shows this intermediate state in which the first and second electrodes 14 and 18, respectively, are in each case formed in a manner isolated from one another.

Figure 7:
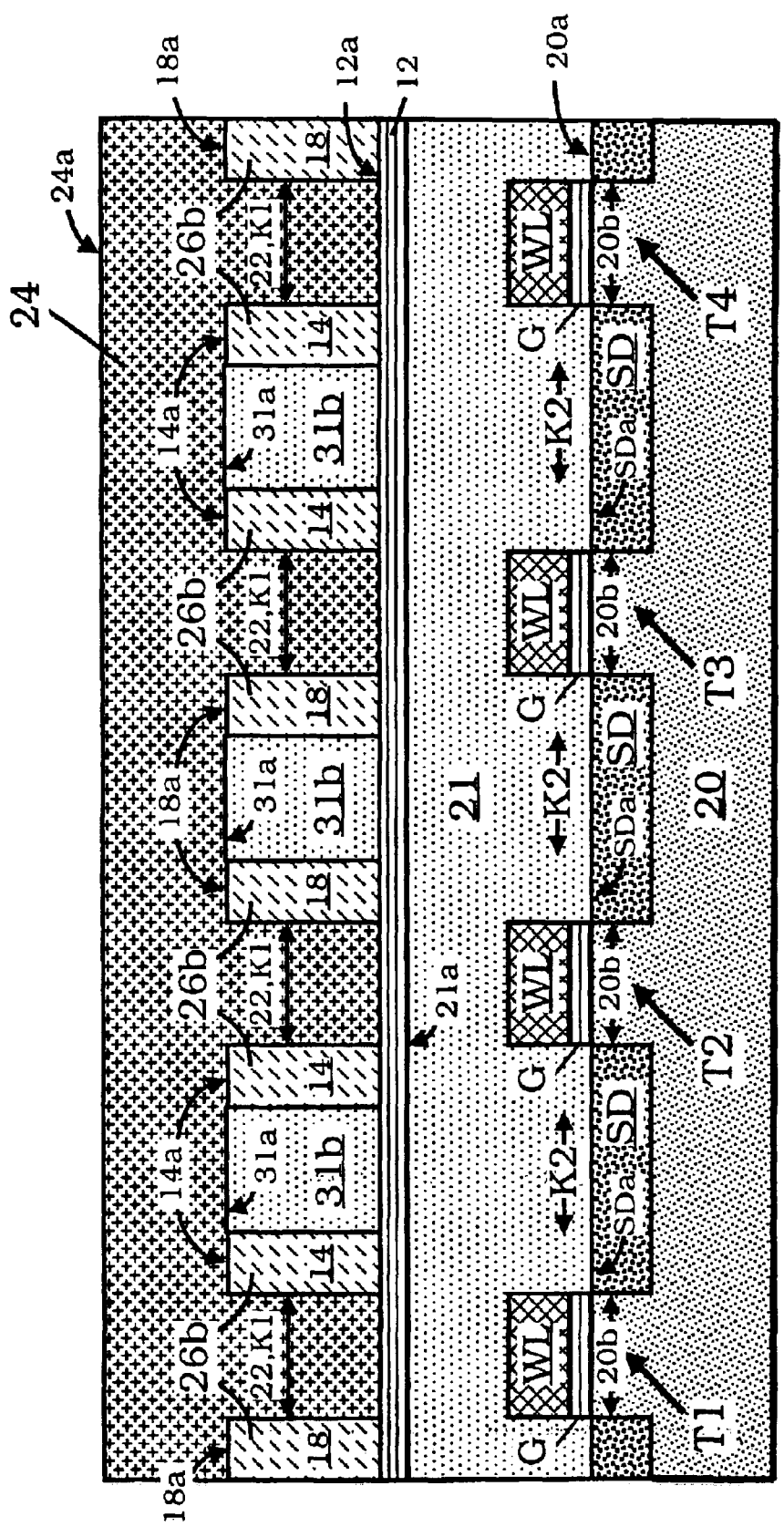
Figure 8:
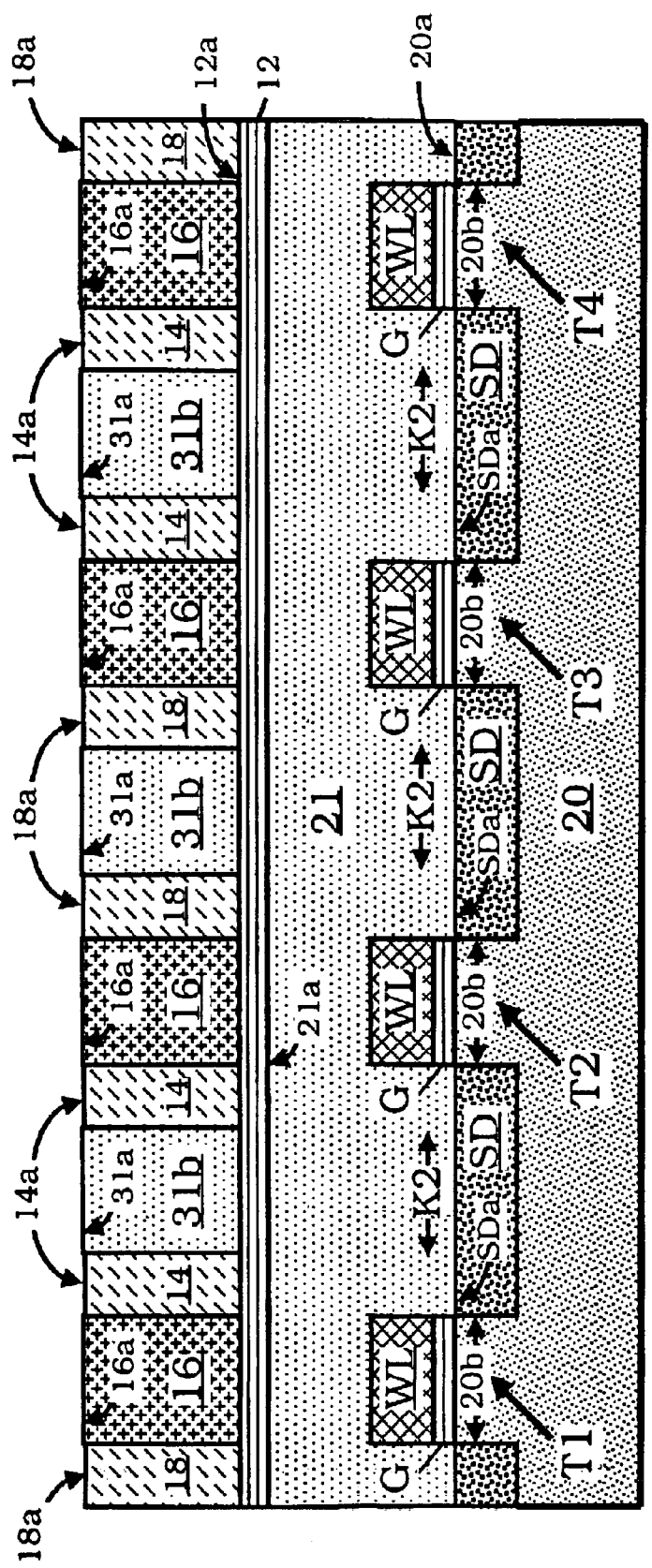

Proceeding from the intermediate state shown in FIG. 6, the cutouts 22 that have remained free are then filled with a corresponding dielectric 16, preferably a ferroelectric. This can be done by coating the prepatterned surface region with a corresponding material layer 24 in an essentially large-area or whole-area or 2D deposition method, so that, in particular, the cutouts 22 between the first and second electrodes 14 and 18 are filled beyond the level of the surface region 31a of the second passivation region 31. Afterward, a polishing step with a stop on the level of the surface region 31a of the passivation region 31 was then carried out. These steps are shown in FIGS. 7 and 8.

Figure 9:
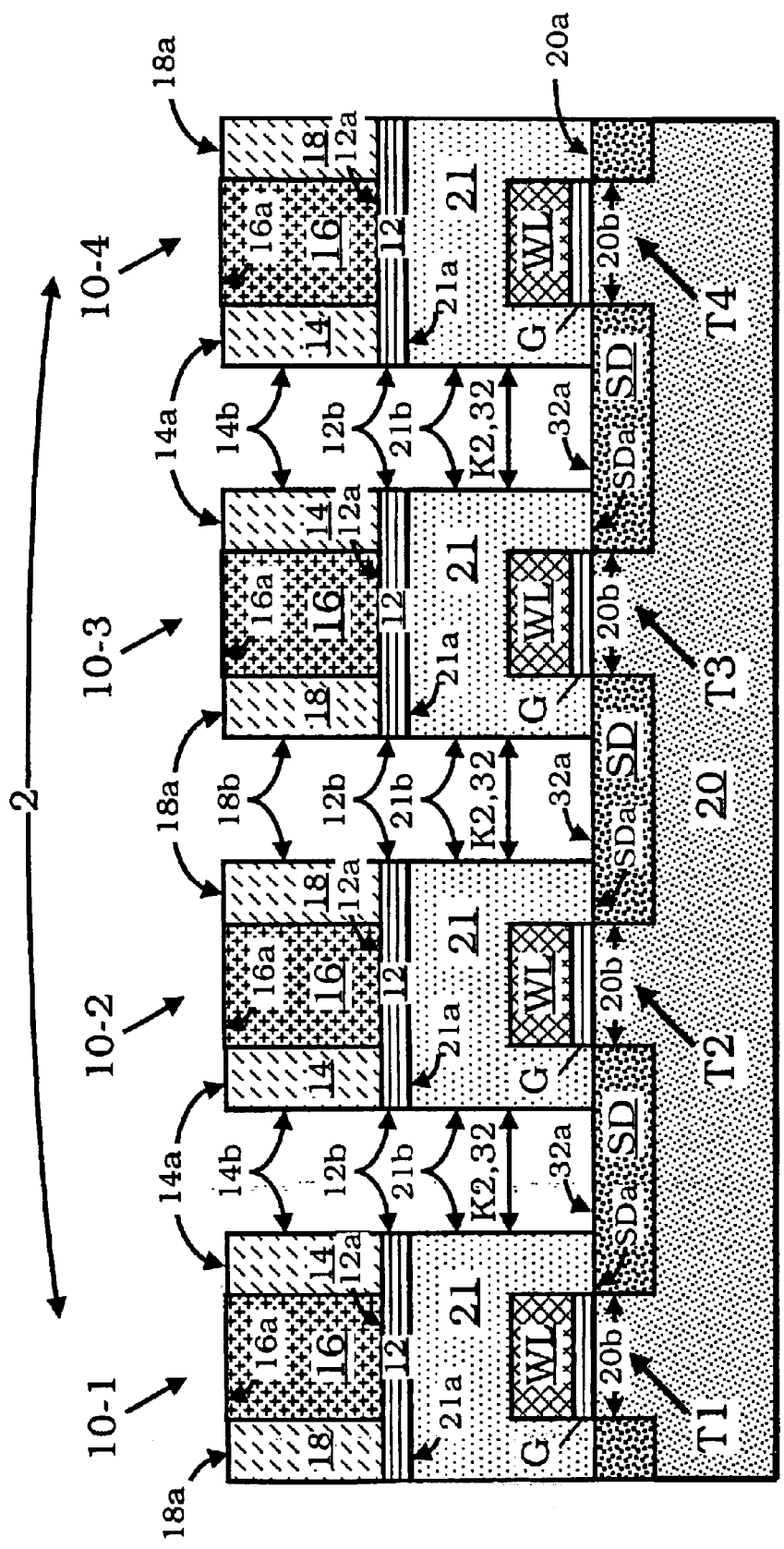

FIG. 9 shows a further intermediate state in the performance of the fabrication method according to the invention, in which cutouts 32 are formed by selective etching in the region of the second defined locations K2. The cutouts 32 extend in a manner proceeding from the level of the surface regions 14a, 16a, 18a as far as the surface region 20a of the semiconductor substrate 20 and, in particular, as far as the surface region SDa of the source/drain region SD of the selection transistors T1, . . . , T4. In this case, the edges 32b of the cutouts 32 are formed by edge regions 14b, 18b and 21b of the first and second electrode devices 14 and 18 and also of the first passivation region 21.

Figure 10:
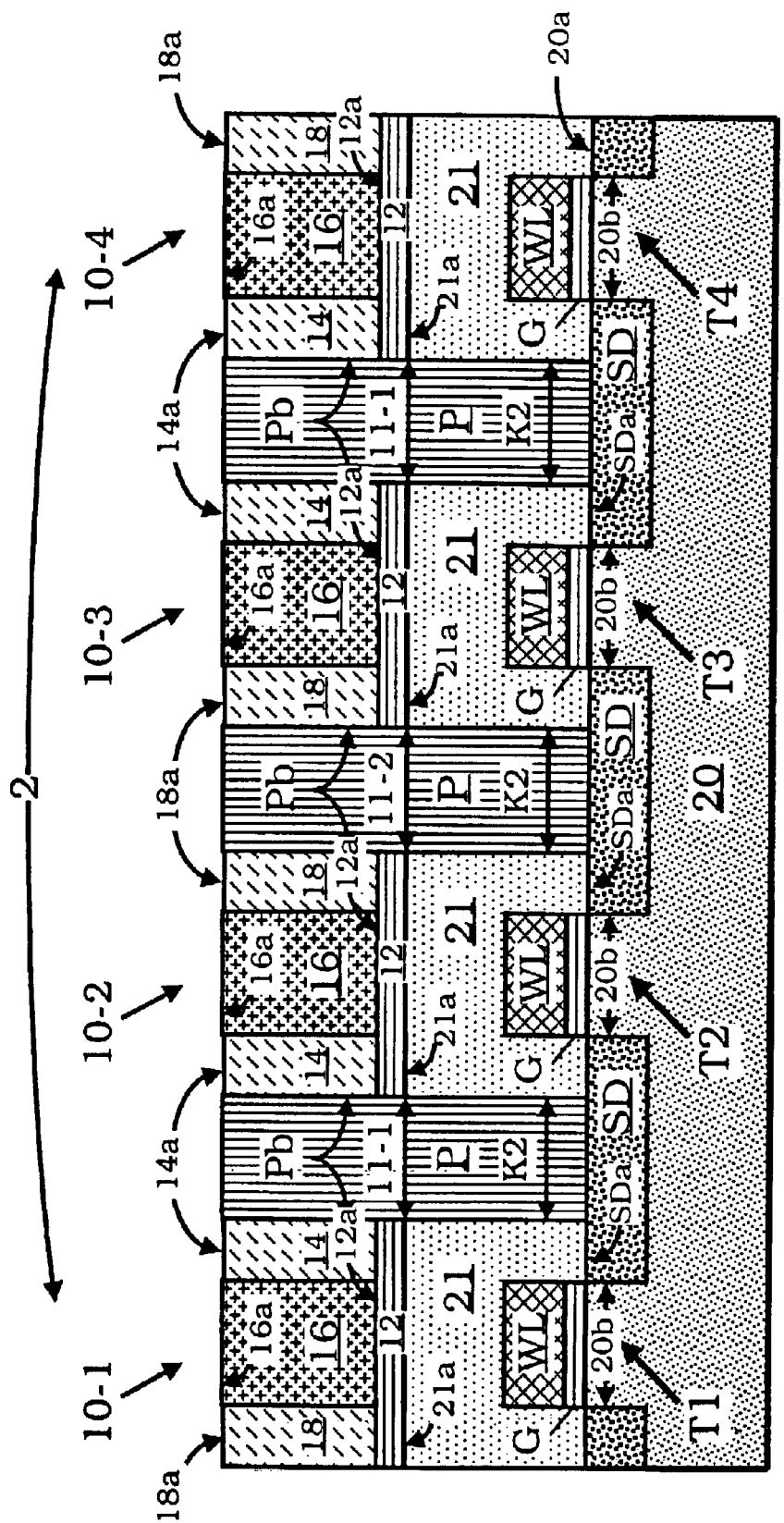

In accordance with FIG. 10, a further material layer of a conductive material is then applied in an essentially two-dimensional, conformal, large-area and/or whole-area manner, in particular the second cutouts 32 in the region of the second predefined locations K2 being completely filled in such a way that an essentially electrically conductive contact or plug region P from the first electrode devices 14 or the second electrode devices 18 to one another and to the respective assigned source/drain regions SD is produced and overall a chain structure can be realized for the capacitor devices 10-1 to 10-4 of the capacitor configuration 2 that have been formed.

Figure 11:
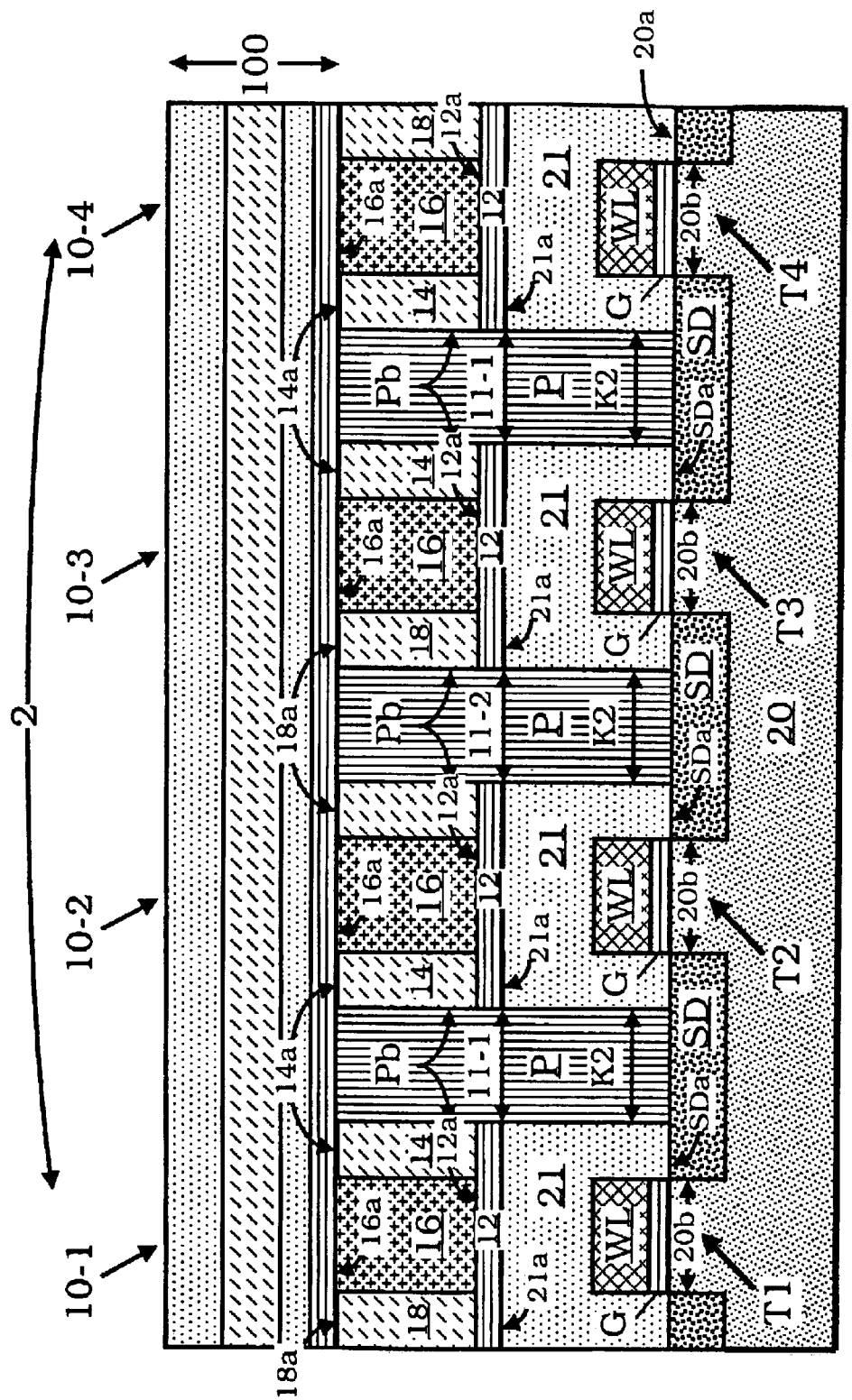

Finally, FIG. 11 shows a further intermediate stage of the fabrication method according to the invention, in which, if appropriate, additional barrier, insulation and contact layers 100 are formed for interconnection purposes.

A further essential aspect of the present invention is that a corresponding dielectric material, in particular a ferroelectric, can be influenced in terms of its crystallization by an underlying layer and can thus be constructed in a desired manner in terms of its crystal properties. In particular, it has been shown by corresponding surface structure analyses and spectroscopic examinations that, for example, PZT on $Al_2O_3$ crystallizes in the [111] direction. The overall result is an identification of the material system $Al_2O_3$/PZT as material system for a vertical chain FeRAM capacitor concept.

The patterning of the barrier layers, in particular with the aid of a bowl structure or the like, produces a particularly advantageous process sequence. As an alternative, the same advantageous configuration can be achieved through the use of a recess process with ARC (Anti Reflective Coating) or with photoresist: in this case, firstly a recess or a cutout is formed in the already completed plug region. Afterward, a TiN layer is applied by sputtering. This is followed by the deposition of a resist and the further formation of a cutout or a recess. The TiN recess subsequently follows. The resist is then removed and this is followed by the deposition of iridium, for example, by sputtering and a subsequent planarization step by CMP (Chemical Mechanical Polishing).

It is also possible for three barrier layers to be buried in a vertical capacitor configuration. In this case, the material combination for the barriers, the electrode and the ferroelectrics differs depending on whether no, one, two or three barrier layers are intended to be formed.

The following special qualities result with regard to the patterning of the dielectric, in particular the ferroelectric: high aspect ratios occur during etching in particular with regard to $4F^2$–$8F^2$ areas. What is important here is that the electrodes are not short-circuited by the double etching of the ferroelectric structures nor at any time do free-standing ferroelectric structures occur whose structure might not be durable and which might fall over.

One possible procedure in the patterning of the dielectric, in particular the ferroelectric, shall be outlined as follows:

After the large-area or whole-area deposition of the $Al_2O_3$ barrier and of the ferroelectric, for example in the form of PZT, an etching process is performed in a first patterning step in order to open regions vertically as far as the TiN/Ir barriers above the plug regions. This is followed by wet-chemical cleaning, in particular of the PZT regions. This results in virtually vertical etching profiles, for example of 83–86° in the case of a Pt/PZT etching. Furthermore, a good selectivity of the oxide mask of more than 0.7:1 is provided.

Afterward, the electrode material, for example $IrO_2$, is deposited in such a way that the cutouts between the PZT regions are filled with contact to the plugs. This may preferably be done by an MOCVD (Metallo Organic Chemical Vapor Deposition) method or the like, preferably in two-dimensional, large-area or whole-area form. If appropriate, planarization is subsequently effected with a stop on the surface of the PZT region, preferably through the use of a CMP method. As an alternative, patterning by an etching process is also conceivable. An annealing step is then also effected.

For the electrical isolation of the individual capacitors, the procedure is then as follows: an etching step with regard to the PZT regions first ensues. This is followed by a wet-chemical cleaning step for the PZT regions. A passivation layer, preferably made of $Al_2O_3$, is then formed. This $Al_2O_3$ layer serves as a hydrogen barrier and also as a barrier against the formation of Pb silicates.

A further central concept of the present invention is the covering—that is optionally to be provided—of the vertical chain FeRAM capacitor structures with $Al_2O_3$. This layer serves, as has already been mentioned, as a hydrogen barrier and as a blocker against the formation of Pb silicate.

We claim:

1. A method for fabricating a semiconductor memory device including a semiconductor region having a surface, source and drain regions within the semiconductor region, and gates between the source and drain regions with gate oxide regions below the gates, intermediate regions disposed between the source and drain regions and above the gate oxide regions and the gates, a first passivation region on the surface of the semiconductor region, and capacitor devices having electrode devices and plugs, the electrode devices being connected with the source and drain regions via the plugs through the first passivation region, the method which comprises:

forming on the semiconductor region having the source and drain regions, the gate oxide regions, and the gates, a passivation region including at least the first passivation region;

forming in the passivation region above the gates and the gate oxide regions, at first locations, first cutouts, the first cutouts not extending to the gates and yielding three-dimensional protruding structures of the passivation region for forming the plugs to be formed at second locations above the source and drain regions;

forming the capacitor devices between the three-dimensional structures of the passivation region;

forming contacts of the capacitor devices and of the electrode devices with the source and drain regions by forming the plugs after forming the capacitor devices by selectively forming second cutouts in the passivation region at the second locations of the pasivation region, the second cutouts extending to the source and drain regions, and by filling the second cutouts with an electrical conducting material.

2. The method according to claim 1, which comprises providing the contact regions as plug regions.

3. The method according to claim 1, which comprises one of forming and patterning a first electrode device, a second electrode device and a dielectric of a respective one of the capacitor devices, in each case in an at least one of partially vertically and locally vertically extending manner with respect to at least one region selected from the group consisting of the semiconductor substrate region, the passivation region, the surface region of the semiconductor substrate region and the surface region of the passivation region, the dielectric being provided substantially between the first and second electrode devices, such that a sequence of the first electrode device, the dielectric and the second electrode device of the respective one of the capacitor devices is formed in one of an at least partially and locally substantially horizontally extending manner with respect to the at least one region selected from the group consisting of the semiconductor substrate region, the passivation region, the surface region of the semiconductor substrate region and the surface region of the passivation region and such that the first electrode device, the dielectric and the second electrode device of the respective one of the capacitor devices are disposed next to one another in at least one surface region selected from the group consisting of the surface region of the semiconductor substrate region and the surface region of the passivation region.

4. The method according to claim 1, which comprises at least partially covering one of the semiconductor substrate region extending substantially horizontally and the surface region of the semiconductor substrate region with at least the passivation region formed of an electrically insulating material having a planar surface region such that the passivation region extends laterally in a substantially two-dimensional manner over a given area.

5. The method according to claim 1, which comprises at least partially covering one of the semiconductor substrate region extending substantially horizontally and the surface region of the semiconductor substrate region with at least the passivation region formed of an electrically insulating material having a planar surface region such that the passivation region extends laterally in a substantially two-dimensional manner substantially entirely over the semiconductor substrate region.

6. The method according to claim 1, which comprises at least partially embedding one of the semiconductor substrate region extending substantially horizontally and the surface region of the semiconductor substrate region with at least the passivation region formed of an electrically insulating material having a planar surface region such that the passivation region extends laterally in a substantially two-dimensional manner over a given area.

7. The method according to claim 1, which comprises at least partially embedding one of the semiconductor substrate region extending substantially horizontally and the surface region of the semiconductor substrate region with at least the passivation region formed of an electrically insulating material having a planar surface region such that the passivation region extends laterally in a substantially two-dimensional manner substantially entirely over the semiconductor substrate region.

8. The method according to claim 1, which comprises forming a barrier selected from the group consisting of a barrier region and a barrier layer on the passivation region such that the barrier extends in a two-dimensional manner over a given area in order to shield underlying regions against diffusion of at least one of undesirable ambient elements and disturbing ambient elements during at least one of an operation and a processing.

9. The method according to claim 1, which comprises forming a barrier selected from the group consisting of a barrier region and a barrier layer on the passivation region such that the barrier extends in a substantially two-dimensional manner substantially entirely over the passivation region in order to shield underlying regions against diffusion of at least one of undesirable ambient elements and disturbing ambient elements during at least one of an operation and a processing.

10. The method according to claim 1, which comprises forming a barrier on the passivation region, the barrier having a planar surface region and being selected from the group consisting of a barrier region and a barrier layer, in order to shield underlying regions against diffusion of at least one of undesirable ambient elements and disturbing ambient elements during at least one of an operation and a processing.

11. The method according to claim 1, which comprises:
forming a first barrier selected from the group consisting of a barrier region and a barrier layer on the passivation region in order to shield underlying regions against diffusion of at least one of undesirable ambient elements and disturbing ambient elements during at least one of an operation and a processing; and
forming a second barrier on the first barrier such that the second barrier extends in a two-dimensional manner over a given area.

12. The method according to claim 1, which comprises:
forming a barrier selected from the group consisting of a barrier region and a barrier layer on the passivation region in order to shield underlying regions against diffusion of at least one of undesirable ambient elements and disturbing ambient elements during at least one of an operation and a processing; and
forming a further passivation region on the barrier such that the further passivation region extends in a substantially two-dimensional manner substantially entirely over the barrier.

13. The method according to claim 1, which comprises:
forming a barrier selected from the group consisting of a barrier region and a barrier layer on the passivation region in order to shield underlying regions against diffusion of at least one of undesirable ambient elements and disturbing ambient elements during at least one of an operation and a processing; and
forming a further passivation region on the barrier, the further passivation region having a planar surface region.

14. The method according to claim 1, which comprises:
forming a barrier selected from the group consisting of a barrier region and a barrier layer on the passivation region in order to shield underlying regions against diffusion of at least one of undesirable ambient elements and disturbing ambient elements during at least one of an operation and a processing;
forming a further passivation region on the barrier; and
forming cutouts in one of given first regions and given first locations in the further passivation region by using a selective etching process such that, as a result, electrically insulated elevated regions are formed on the barrier.

15. The method according to claim 1, which comprises:
forming a barrier selected from the group consisting of a barrier region and a barrier layer on the passivation region in order to shield underlying regions against diffusion of at least one of undesirable ambient elements and disturbing ambient elements during at least one of an operation and a processing;
forming a further passivation region on the barrier; and
forming cutouts in one of given first regions and given first locations in the further passivation region such that the cutouts are spaced vertically from one of a level of the barrier and a surface region of the barrier and such that, as a result, electrically insulated elevated regions are formed on the barrier.

16. The method according to claim 15, which comprises selecting one of the given first regions and the given first locations above and between source/drain regions of selection transistor devices, the source/drain regions being provided in the surface region of the semiconductor substrate region.

17. The method according to claim 15, which comprises selecting one of the given first regions and the given first locations between one of given second regions and given second locations of the contact regions provided for contact-connecting the capacitor configuration to the surface region of the semiconductor substrate region.

18. The method according to claim 1, which comprises:
forming a barrier selected from the group consisting of a barrier region and a barrier layer on the passivation region in order to shield underlying regions against diffusion of at least one of undesirable ambient elements and disturbing ambient elements during at least one of an operation and a processing;
forming a further passivation region on the barrier; and
forming cutouts in one of given first regions and given first locations in the further passivation region such that the cutouts are formed vertically at least partially as far as a level of a surface region of the barrier.

19. The method according to claim 1, which comprises:
forming a barrier selected from the group consisting of a barrier region and a barrier layer on the passivation region in order to shield underlying regions against diffusion of at least one of undesirable ambient elements and disturbing ambient elements during at least one of an operation and a processing;
forming a further passivation region on the barrier; and
forming cutouts in one of given first regions and given first locations in the further passivation region such that the cutouts are formed laterally at least partially at least as far as edge regions of plug regions serving as the contact regions, and such that, as a result, edge regions of the cutouts are provided as the edge regions of the plug regions.

20. The method according to claim 1, which comprises:
forming a barrier selected from the group consisting of a barrier region and a barrier layer on the passivation region in order to shield underlying regions against diffusion of at least one of undesirable ambient elements and disturbing ambient elements during at least one of an operation and a processing;
forming a further passivation region on the barrier;
forming cutouts in one of given first regions and given first locations in the further passivation region; and
depositing at least one material region for the electrode devices, the at least one material region being formed of at least one electrically conductive material.

21. The method according to claim 20, which comprises using at least one of a metal and a metal oxide deposited as the at least one electrically conductive material.

22. The method according to claim 20, which comprises depositing the at least one material region for the electrode devices with a deposition process selected from the group consisting of a conformal deposition process and a 2D deposition process.

23. The method according to claim 20, which comprises depositing the at least one material region for the electrode devices such that the at least one material region covers a given area.

24. The method according to claim 20, which comprises depositing the at least one material region for the electrode devices such that the at least one material region substantially entirely covers the further passivation region.

25. The method according to claim 20, which comprises depositing the at least one material region for the electrode devices such that the at least one material region at least one of lines and covers edge regions of the cutouts.

26. The method according to claim 20, which comprises depositing the at least one material region for the electrode devices such that the at least one material region at least one of lines and covers elevated regions provided between the cutouts.

27. The method according to claim 20, which comprises removing at least substantially laterally extending regions of the at least one material region for the electrode devices by one of an eroding step and an anisotropic etching-back step, in order to isolate electrode devices that are not to be contact-connected, such that, as a result, substantially vertically extending regions for forming the electrode devices are provided adjacent to insulating elevated regions. least one electrically conductive material.

28. A method for fabricating a semiconductor memory device, the method which comprises:
forming a CMOS structure in at least one region selected from the group consisting of a horizontally extending semiconductor substrate region, a passivation region, a surface region of the semiconductor substrate region, and a surface region of the passivation region;
forming a capacitor configuration in at least one region selected from the group consisting of the semiconductor substrate region, the passivation region, the surface region of the semiconductor substrate region, and the surface region of the passivation region such that the capacitor configuration includes a plurality of capacitor devices having electrode devices and serving as storage elements;
one of forming and patterning the capacitor devices in each case in an at least one of partially vertically and locally vertically extending manner with respect to at least one region selected from the group consisting of the semiconductor substrate region, the passivation region, the surface region of the semiconductor substrate region, and the surface region of the passivation region such that, as a result, in each case one of a three-dimensional assembly and a three-dimensional structure extending at least one of partially and locally into a third dimension with respect to a given region extending substantially in a first and a second dimension is formed, the given region being selected from the group consisting of the semiconductor substrate region, the passivation region, the surface region of the semiconductor substrate region, and the surface region of the passivation region;
contacting the capacitor devices and the electrode devices with the CMOS structure by contact regions after forming the capacitor devices;
forming a barrier selected from the group consisting of a barrier region and a barrier layer on the passivation region in order to shield one of underlying regions and the CMOS structure against diffusion of at least one of undesirable ambient elements and disturbing ambient elements during at least one of an operation and a processing;
forming a further passivation region on the barrier;
forming cutouts in one of given first regions and given first locations in the further passivation region;
depositing at least one material region for the electrode devices, the at least one material region being formed of at least one electrically conductive material;

removing at least substantially laterally extending regions of the at least one material region for the electrode devices by one of an eroding step and an anisotropic etching-back step, in order to isolate electrode devices that are not to be contact-connected, such that, as a result, substantially vertically extending regions for forming the electrode devices are provided adjacent to insulating elevated regions;

providing the barrier layer and regions thereof having a free surface in each case as at least one of a barrier region for dielectric isolation and an insulation region for dielectric isolation; and providing, on lateral bottom regions of the cutouts and on the free surface of the barrier layer, in each case, at least one of an additional barrier and an insulation region for dielectric isolation.

29. The method according to claim 28, which comprises providing the at least one of the additional barrier and the insulation region for the dielectric by using one of a specific deposition and an anisotropic deposition.

30. The method according to claim 28, which comprises providing the at least one of the additional barrier and the insulation region for the dielectric by using at least one substantially electrically insulating material.

31. The method according to claim 28, which comprises forming at least one of the barrier region for the dielectric and the insulation region for the dielectric in each case with a plurality of layers.

32. The method according to claim 28, which comprises forming at least one of the barrier region for the dielectric and the insulation region for the dielectric in a topmost region substantially remote from the semiconductor substrate region in each case as a nucleation layer for the dielectric to be applied thereon, in order to support one of a desired structure and a desired crystal structure of the dielectric during at least one step selected from the group consisting of a processing step, a heat treatment step and an operation of the semiconductor memory device.

33. The method according to claim 28, which comprises forming at least one of the barrier region for the dielectric and the insulation region for the dielectric in a topmost region substantially remote from the surface region of the semiconductor substrate region in each case as a nucleation layer for the dielectric to be applied thereon, in order to support one of a desired structure and a desired crystal structure of the dielectric during at least one step selected from the group consisting of a processing step, a heat treatment step and an operation of the semiconductor memory device.

34. The method according to claim 28, which comprises depositing a material region for the dielectric on at least one of the barrier region for the dielectric and the insulation region for the dielectric, such that the material region for the dielectric is deposited as a ferroelectric by a deposition process selected from the group consisting of a two-dimensional deposition and a conformal deposition.

35. The method according to claim 28, which comprises depositing a material region for the dielectric on at least one of the barrier region for the dielectric and the insulation region for the dielectric, such that the material region for the dielectric is deposited on a given area.

36. The method according to claim 28, which comprises depositing a material region for the dielectric on at least one of the barrier region for the dielectric and the insulation region for the dielectric, such that the material region for the dielectric covers the at least one of the barrier region for the dielectric and the insulation region substantially entirely.

37. The method according to claim 28, which comprises depositing a material region for the dielectric on at least one of the barrier region for the dielectric and the insulation region for the dielectric, such that the material region for the dielectric fills the cutouts as far as a level of a surface region of the barrier region.

38. The method according to claim 35, which comprises polishing the deposited material region for the dielectric as far as a level of a surface region of the further passivation region, in order to form in each case a region for the dielectric between the electrode devices.

39. The method according to claim 34, which comprises subjecting at least one of the material region for the dielectric and the dielectric to a temper process under at least one process condition selected from the group consisting of an elevated temperature and a defined process atmosphere in order to form at least one of a crystal structure and a ferroelectric property of the dielectric.

40. The method according to claim 39, which comprises using oxygen as a constituent in the defined process atmosphere.

41. The method according to claim 34, which comprises:
forming further cutouts at given second regions above source/drain regions of selection transistor devices by using a selective etching process;
removing electrically insulating elevated regions such that one of side regions and edge regions of the electrode devices are uncovered at least in part; and
eroding the barrier region and the passivation region in a region of the given second regions as far as a level of the surface of the semiconductor substrate region such that a surface region of the source and drain regions of the selection transistor devices is uncovered in each case.

42. The method according to claim 41, which comprises depositing a material region for the contact regions of an electrically conductive material such that, as a result, one of first ones of the electrode devices and second ones of the electrode devices, that are opposite one another in the further cutouts, are electrically contact-connected together with a respective one of the source and drain regions by a respective one of the contact regions.

43. The method according to claim 41, which comprises forming, with a two-dimensional deposition, a material region for the contact regions of an electrically conductive material such that, as a result, one of first ones of the electrode devices and second ones of the electrode devices, that are opposite one another in the further cutouts, are electrically contact-connected together with a respective one of the source and drain regions by a respective one of the contact regions.

44. The method according to claim 43, which comprises forming, with the two-dimensional deposition, the material region in a conformal manner such that the material region covers a given area.

45. The method according to claim 41, which comprises depositing a material region for the contact regions of an electrically conductive material such that the further cutouts in each case are filled as far as a level of a surface region of the source and drain regions and such that a subsequent polishing is performed as far as a level of surface regions of the electrode devices and the dielectric, and, as a result, one of first ones of the electrode devices and second ones of the electrode devices, that are opposite one another in the further cutouts, are electrically contact-connected together with a respective one of the source and drain regions by a respective one of the contact regions.

46. The method according to claim 1, which comprises providing the capacitor configuration as an at least partially connected structure by forming at least some of the capacitor devices such that a first electrode device of one of the capacitor devices contacts, via a first contact element, a first electrode device of another one of the capacitor devices disposed spatially directly adjacent to the one of the capacitor devices, and such that a second electrode device of the one of the capacitor devices contacts, via a second contact element, a second electrode device of the another one of the capacitor devices disposed spatially directly adjacent to the one of the capacitor devices.

47. The method according to claim 1, which comprises providing the capacitor configuration as a chain structure by forming at least some of the capacitor devices such that a first electrode device of one of the capacitor devices contacts, via a first contact element, a first electrode device of another one of the capacitor devices disposed spatially directly adjacent to the one of the capacitor devices, and such that a second electrode device of the one of the capacitor devices contacts, via a second contact element, a second electrode device of the another one of the capacitor devices disposed spatially directly adjacent to the one of the capacitor devices.

48. The method according to claim 46, which comprises forming the first electrode device of the one of the capacitor devices, the first contact element and the first electrode device of the another one of the capacitor devices as an one-piece electrically conductive region including a plug region.

49. The method according to claim 46, which comprises forming the second electrode device of the one of the capacitor devices, the second contact element and the second electrode device of the another one of the capacitor devices as an one-piece electrically conductive region including a plug region.

50. The method according to claim 1, which comprises forming a chain FeRAM memory.

* * * * *